United States Patent
Ishida

(10) Patent No.: US 7,210,952 B2
(45) Date of Patent: May 1, 2007

(54) CIRCUIT COMPONENT SOCKET AND METHOD FOR MOUNTING THE SAME

(75) Inventor: Mayumi Ishida, Oume (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/342,685

(22) Filed: Jan. 31, 2006

(65) Prior Publication Data

US 2006/0216982 A1 Sep. 28, 2006

(30) Foreign Application Priority Data

Jan. 31, 2005 (JP) ............................ 2005-024452

(51) Int. Cl.
*H01R 13/62* (2006.01)

(52) U.S. Cl. ..................................... 439/331
(58) Field of Classification Search ................ 439/331, 439/342, 73
See application file for complete search history.

(56) References Cited

U.S. PATENT DOCUMENTS

| | | | | |
|---|---|---|---|---|
| 6,485,320 B1 * | 11/2002 | Ma | ............................ | 439/342 |
| 6,726,500 B1 * | 4/2004 | McHugh et al. | ............ | 439/331 |
| 6,752,636 B2 * | 6/2004 | Ma | ............................ | 439/73 |
| 6,776,642 B1 * | 8/2004 | McHugh et al. | ............ | 439/331 |
| 6,939,140 B2 * | 9/2005 | Liao | ............................. | 439/41 |
| 6,948,947 B2 * | 9/2005 | Lee et al. | ...................... | 439/73 |
| 6,957,973 B1 * | 10/2005 | McHugh et al. | ............ | 439/331 |
| 6,971,902 B2 * | 12/2005 | Taylor et al. | ............... | 439/342 |
| 6,974,345 B2 * | 12/2005 | Yang et al. | ................. | 439/331 |
| 7,014,489 B2 * | 3/2006 | Ma | ............................. | 439/331 |
| 7,074,068 B1 * | 7/2006 | Ma | ............................. | 439/331 |
| 7,083,457 B2 * | 8/2006 | Ma | ............................. | 439/331 |

FOREIGN PATENT DOCUMENTS

JP 04-022081 1/1992

* cited by examiner

*Primary Examiner*—Chandrika Prasad
*Assistant Examiner*—Harshad C Patel
(74) *Attorney, Agent, or Firm*—Pillsbury Winthrop Shaw Pittman LLP

(57) ABSTRACT

According to one embodiment, a circuit component socket includes: a frame; a base member attached to the frame, the base member having a surface where a circuit component storage portion is formed for storing a circuit component, and a connection terminal surface as an opposite surface where connection terminals are formed to be electrically connected to electrodes of the circuit component stored in the circuit component storage portion and to be connected to a circuit board; and a pressure clamping unit that presses the circuit component stored in the circuit component storage portion to the base member. The base member is formed so that the connection terminal surface of the base member is displaced by a predetermined amount in a direction toward the circuit component storage portion.

5 Claims, 5 Drawing Sheets

CIRCUIT COMPONENT SOCKET AND METHOD FOR MOUNTING THE SAME

CROSS-REFERENCE TO RELATED APPLICATIONS

This application is based upon and claims the benefit of priority from Japanese Patent Application No. 2005-024452, filed Jan. 31, 2005, the entire contents of which are incorporated herein by reference.

BACKGROUND

1. Field

One embodiment of the invention relates to a socket used when a circuit component such as a semiconductor circuit component having a surface mount type package is mounted on a circuit board. It particularly relates to a circuit component socket configured so as to be connected to a circuit board through metal bumps such as solder balls, and a method for mounting the circuit component socket.

2. Description of the Related Art

A wide variety of such packages serving as semiconductor circuit components to be mounted on circuit boards have advanced in recent years so that surface mount type leadless packages which do not use any lead or pin for electric connection to the boards have been put into practical use broadly.

For example, a BGA (Ball Grid Array) package, an LGA (Land Grid Array) package, etc. , are used as such surface mount type leadless packages. In the BGA package, connection terminals are formed in such a manner that solder balls are attached to electrodes (pads) which are formed, for example, as a grid array, on the bottom of the package so as to be connected to an external circuit. In the LGA package, pads (lands) formed as a grid array on the bottom of the package are used directly as connection terminals.

There is also known a CSP (Chip Size Package) having substantially the same size as that of a bare chip constituting a semiconductor. This CSP also has pads provided on the bottom of the package.

Generally, an LGA circuit component is mounted on a circuit board through a socket. The socket includes a base member, and an elastic pressure clamping unit. A circuit component storage portion is formed in the base member so that the LGA circuit component is placed in the circuit component storage portion. The circuit component storage portion has contactors arranged so as to correspond to lands formed as a grid array on the bottom of the LGA circuit component in a predetermined positional relation. The elastic pressure clamping unit presses and clamps the placed LGA circuit component to the base member by a predetermined elastic force to thereby keep the lands of the LGA circuit component and the contactors in contact with each other stably.

The base member has electrodes provided on its bottom on a side opposite to the circuit component storage portion in which the LGA circuit component is placed. These electrodes are electrically connected to the contactors of the circuit component storage portion. In addition, solder balls are attached to the electrodes respectively, so that the electrodes of the base member are connected to pads of the circuit board by the solder balls.

Such an LGA circuit component socket will be described with reference to the drawings. FIG. 4 is a perspective view for explaining a well-known LGA circuit component socket which is generally used at present. FIG. 5 is a partly sectional side view of the socket depicted in FIG. 4. Incidentally, FIG. 5 is a schematic view for making description clearly understandable but is different from FIG. 4 in detailed parts.

In FIG. 4, a socket 401 is formed to have a flat plate-shaped metal frame 402 as a foundation. A base member 403 is fixed in the central portion of the socket 401. The base member 403 forms a body of the socket 401. The base member 403 is molded out of synthetic resin so as to be shaped like an approximately flattened cube in terms of outer appearance. Frames 404 are formed on outer edges of four sides of the base member 403 respectively so as to stand with respect to a flat surface of the base member 403.

The inside enclosed by the frames 404 is a circuit component storage portion 405 in which an LGA circuit component is stored. The circuit component storage portion 405 is partitioned into fine regions by partition portions 406 provided in parallel with one side of the frames 404. Contactors 407 are provided in each of the fine regions into which the circuit component storage portion 405 is partitioned by the partition portions 406. Further, protrusions 408 are formed so as to face the inner surfaces of the frames 404. An opening 409 is formed in the approximately central portion of the circuit component storage portion 405.

Incidentally, although only part of the contactors 407 are shown in FIG. 4 for the sake of convenience of illustration, the contactors 407 are actually provided in almost the whole sections into which the circuit component storage portion 405 is partitioned by the partition portions 406.

That is, as shown in FIG. 5, each of the contactors 407 has an end which protrudes from the surface of the circuit component storage portion 405 so as to be bent, and an opposite end which is connected to an electrode not shown but provided on the bottom of the base member 403. A solder ball 410 is further attached to the electrode. The contactors 407 configured as described above are provided in arrangement so as to correspond to electrodes formed on the bottom of the LGA circuit component.

Four sides of the metal frame 402 are bent so that part or all of the edges in the four sides stand. A pressure clamping cover 412 for pressing and clamping the circuit component to the circuit component storage portion 405 is attached to a side wall 411 of one of the four sides so that the pressure clamping cover 412 can rotate in a direction of covering the circuit component storage portion 405 (represented by an arrow A in FIG. 5) and in a direction (represented by an arrow B in FIG. 5) opposite to the covering direction.

That is, openings 413 are provide in the side wall 411 of the metal frame 402 so that engagement portions 414 formed at an end of the pressure clamping cover 412 are rotatably engaged with the openings 413.

An opening 415 through which a top portion of the body of the LGA circuit component passes is provided in the central portion of the pressure clamping cover 412. The pressure clamping cover 412 is configured so that the edge of the opening 415 comes into contact with the flange portion of the LGA circuit component to thereby perform pressure clamping. Details of the pressure clamping cover 412 will be described later.

A protrusion piece 416 is provided in a side of the pressure clamping cover 412 opposite to the side where the engagement portions 414 are formed. Further, edges of two sides of the pressure clamping cover 412 adjacent to the side where the protrusion piece 416 is provided are bent toward the metal frame 402 to thereby form bent portions 417. The bent portions 417 ensure the strength required for the pressure clamping cover 412.

As shown in FIG. 5, the pressure clamping cover 412 is bent with a predetermined curvature so as to be warped in a direction opposite to the circuit component storage portion 405 from the side where the engagement portions 414 are formed toward the side where the protrusion piece 416 is provided. An angular difference Φ is formed in a region of from the engagement portions 414 to the protrusion piece 416.

A pressure clamping lever 419 is attached to a side wall 418 of the metal frame 402 opposite to the side wall 411 where the pressure clamping cover 412 is attached, so that the pressure clamping lever 419 can rotate in a direction of covering the component storage portion 405 (represented by an arrow C in FIG. 5) and in a direction (represented by an arrow D in FIG. 5) opposite to the covering direction. The side wall 418 of the metal frame 402 forms a pair of holding portions 420 for holding the pressure clamping lever 419. Ends of the holding portions 420 are bent toward the component storage portion 405 so that the pressure clamping lever 419 can be rotatably held in the inside of the holding portions 420.

Support portions 423 for supporting the lower surface of the pressure clamping lever 419 are formed at ends provided on the holding portion 420 sides of two side walls 421 and 422 which are provided in the metal frame 402 and which are adjacent to the side wall 411. The pressure clamping lever 419 has its lower surface supported by the support portions 423 and its upper surface held by the holding portions 420, so that the pressure clamping lever 419 can be supported rotatably.

The pressure clamping lever 419 is made of an elastic material. A portion of the pressure clamping lever 419 located between the pair of holding portions 420 is bent so as to protrude at a predetermined angle. In this manner, a pressure contact portion 424 is formed. An end of the pressure clamping lever 419 on the side wall 421 side of the metal frame 402 is bent and extended to form an operation portion 425 which can be operated by a user.

As shown in FIG. 5, the operation portion 425 is formed so that the operation portion 425 can be opened to the outside (in the direction of the arrow D) at a predetermined angle relative to the pressure contact portion 424.

An opening 426 is further formed in the metal frame 402 and between the base member 403 and the side wall 418 so that the protrusion piece 416 of the pressure clamping cover 412 does not interfere.

A lock portion 427 for locking the operation portion 425 of the pressure clamping lever 419 is further formed in a predetermined position of the side wall 421 of the metal frame 402.

The socket for mounting the LGA circuit component on the circuit board is configured as described above. Next, the LGA circuit component will be described. FIG. 6 is a perspective view showing an example of the LGA circuit component to be mounted in the socket shown in FIGS. 4 and 5.

In FIG. 6, an LGA circuit component 601 includes a base 602 made of a circuit board, and a semiconductor package mounted on a surface of the base 602 and externally covered with a metal housing. The metal housing has a flange portion 603 mounted on the base 602, and a body portion 604 provided on a surface of the flange portion 603. On the other hand, the base 602 has notches 605 formed for positioning the LGA circuit component 601 at the time of mounting the LGA circuit component 601 in the socket.

FIG. 7 is a plan view of the LGA circuit component 601 shown in FIG. 6, as seen from the bottom side of the base 602. As shown in FIG. 7, plural electrodes 701 are arranged in a grid array. The electrodes 701 are arranged so as to correspond to the contactors 407 of the base member 403. When the LGA circuit component 601 is stored in the circuit component storage portion 405, the electrodes 701 are brought into contact with the contactors 407, respectively, so as to be electrically connected.

Next, a procedure of mounting the LGA circuit component 601 depicted in FIGS. 6 and 7 on the socket 401 depicted in FIGS. 4 and 5 will be described.

As shown in FIG. 8, the LGA circuit component 601 is stored in the circuit component storage portion 405 of the base member 403. This operation is performed in such a manner that the LGA circuit component 601 is placed on the circuit component storage portion 405 while the notches 605 of the base 602 of the LGA circuit component 601 are aligned with the protrusions 408 formed on the frames 404 of the base member 403.

Then, the pressure clamping cover 412 is rotated in the direction of the arrow A in FIG. 5 so as to be brought into contact with the top of the LGA circuit component 601. On this occasion, the top portion of the body portion 604 of the LGA circuit component 601 protrudes from the opening 415 of the pressure clamping cover 412, so that the edge of the opening 415 comes into contact with the top of the flange portion 603 of the LGA circuit component 601.

Then, the pressure clamping lever 419 is rotated in the direction of the arrow C in FIG. 5 to bring the pressure contact portion 424 of the pressure clamping lever 419 into contact with the top of the protrusion piece 416 of the pressure clamping cover 412.

When the pressure clamping lever 419 is rotated in the direction of the arrow C in this state, the protrusion piece 416 suffers force toward the base member 403 due to the pressure contact portion 424 of the pressure clamping lever 419. As a result, the pressure clamping cover 412 is pressed and clamped onto the flange portion 603 of the LGA circuit component 601 gradually.

When the pressure clamping lever 419 is finally locked by the lock piece 427 of the side wall 421 of the metal frame 402 while further rotated in the direction of the arrow C, mounting of the LGA circuit component 601 in the socket 401 is completed.

This state is shown in FIG. 9. As shown in FIG. 9, while the pressure clamping lever 419 makes the pressure contact portion 424 press the protrusion piece 416 of the pressure clamping cover 412, the operation portion 425 is locked by the lock piece 427 of the side wall 421 of the metal frame 402. Thus, it is clearly shown that the pressure clamping cover 412 makes the edge of the opening 415 presses and clamps the flange portion 603 of the LGA circuit component 601. In this state, the pressure clamping cover 412 presses and clamps the LGA circuit component 601 into the circuit component storage portion 405 of the base member 403 by elastic force corresponding to the angle between the pressure contact portion 424 of the pressure clamping lever 419 and the operation portion 425 of the pressure clamping lever 419.

The LGA circuit component 601 is mounted in the socket 401 configured as described above after the socket 401 is mounted on the circuit board by the solder balls 410 of the base member 403.

When the pressure clamping cover 412 presses and clamps the LGA circuit component 601 by the elastic force of the pressure clamping lever 419, the pressure clamping force of the pressure clamping cover 412 is considerably strong. Since the pressure clamping cover 412 is formed so as to be curved to warp with a predetermined curvature from the engagement portions 414 to the protrusion piece 416 as shown in FIG. 5, the largest stress is applied to the LGA circuit component 601 in the vicinity of the central portion of the pressure clamping cover 412.

The stress may act on the base member 403 through the LGA circuit component 601 to thereby cause deformation of the base member 403. In such a case, the surface where the solder balls 410 are attached is consequently not flat any more, so that the soldering states are not uniform among the solder balls at the time of mounting. As a result, soldering failure might occur.

FIG. 10 is a view for explaining the state of deformation of the base member 403. As shown in FIG. 10, the base member 403 is deformed so that the base member 403 on the side wall 411 side of the metal frame 402 and on the holding portion 420 side for holding the pressure clamping lever 419 rises with respect to the flat surface.

For example, the deformation may cause a short-circuiting due to connection of the solder balls to one another, soldering junction failure, incomplete electrical connection or disconnection of the socket 401 from the circuit board due to insufficient mechanical strength of the soldering junction portions, in the rising outer side portions of the base member 403.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Figure 1:
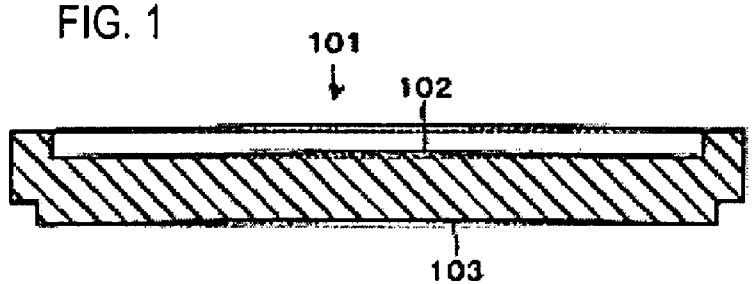
FIG. 1 is a view for explaining an exemplary base member used in a circuit component socket according to an embodiment of the invention.

Various embodiments according to the invention will be described below in detail with reference to the drawings. FIG. 1 is a sectional view for explaining the configuration of a base member used in a socket according to an embodiment of the invention.

A base member 101 used in the socket according to an embodiment of the invention has a circuit component storage portion 102 formed in a front surface of the base member 101 so as to be lower in level than the front surface of the base member 101, and a connection terminal surface 103 which is provided as a surface opposite to the front surface and to which solder balls not shown will be attached. Although not shown in FIG. 1, the circuit component storage portion 102 is partitioned into regions by partition portions and contactors are provided in each of the regions in the same manner as in the base member 403 of the socket 401 shown in FIGS. 4 and 5 and FIGS. 8 to 10. The contactors are connected to electrodes not shown but formed on the connection terminal surface 103. Solder balls are further attached to the electrodes respectively to thereby form external terminals.

In addition to the aforementioned configuration, the base member 101 used in the socket according to the embodiment has such a structure that the connection terminal surface 103 and the bottom of the circuit component storage portion 102 are curved in a direction toward the circuit component storage portion 102 so that their central portions are upper than their end portions as shown in FIG. 1. In FIG. 1, the dotted line is a straight line whereas the central portion of each of the connection terminal surface 103 and the bottom of the circuit component storage portion 102 is formed to be curved with a predetermined curvature in a direction toward the circuit component storage portion 102.

The curvature on this occasion is set at a value large enough to cancel deformation of the base member 101 caused by the pressure clamping cover 412 and the pressure clamping lever 419. The curvature may be measured experimentally.

When the base member 101 configured as described above is incorporated into the socket together with the other constituent members shown in FIGS. 4 and 5 and FIGS. 8 to 10, the amount of deformation of the base member caused by stress applied on the base member by the pressure clamping cover and the pressure clamping lever at the time of mounting the circuit component is cancelled by the amount of pre-deformation of the base member. Accordingly, the connection terminal surface 103 can be kept flat.

As a result, when a circuit component is mounted in the socket having been mounted on a circuit board, the connection terminal surface 103 and the mounting surface of the circuit board are kept approximately in parallel with each other so that the state of connection of the socket to the circuit board through the solder balls can be kept good. Accordingly, it is possible to reduce an accident such as soldering failure.

When the socket in which the base member 101 depicted in FIG. 1 has been incorporated is to be mounted on the circuit board, the connection terminal surface 103 may be deformed to be flat, by mounting a dummy circuit component on the circuit component storage portion. In this manner, the mounting can be executed easily. As the dummy circuit component used on this occasion, a dummy circuit component having the same outer size as that of the LGA circuit component shown in FIG. 5 can be used.

Figure 2:
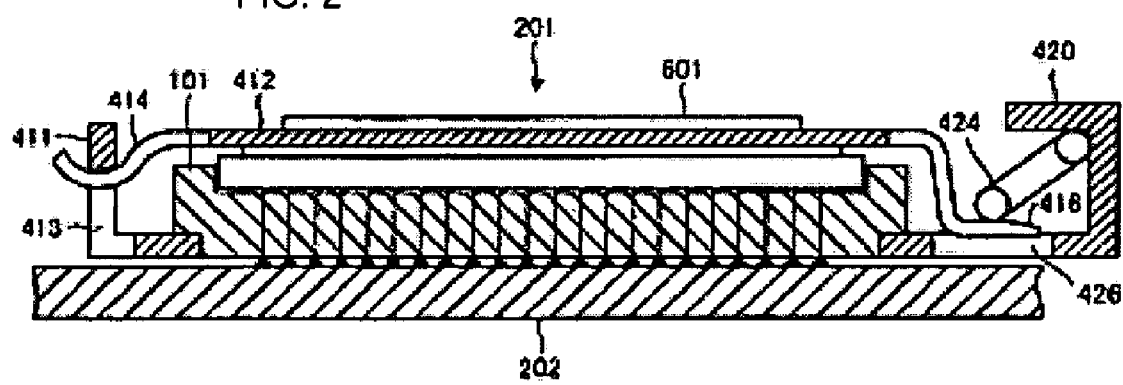
FIG. 2 is a party sectional side view for explaining the socket according to the embodiment of the invention in which the base member depicted in FIG. 1 is used.

FIG. 2 shows a state where a socket 201 using a base member 101 shown in FIG. 1 is mounted on a circuit board 202 and an LGA circuit component 601 is mounted in the socket 401. Incidentally, in FIG. 2, other constituent members than the base member 101 are configured in the same manner as those shown in FIGS. 4 to 10 and referred to by the same numerals, so that detailed description thereof will be omitted. Even when the base member 101 in the socket 201 is intended to be deformed by stress applied from the pressure clamping cover 412 and the pressure clamping lever 419 so that the central portion of the base member 101 protrudes toward the connection terminal surface 103 side, the amount of deformation is cancelled by the curvature of the central portion of the base member 101 because the central portion of the base member 101 is curved toward the side opposite to the connection terminal surface 103 in advance. Consequently, the connection terminal surface 103 of the base member 101 is kept flat.

In this manner, the connection terminal surface 103 of the base member 101 is kept flat and approximately parallel with the mounting surface of the circuit board 202. Accordingly, the junction portions between the circuit board 202 and the socket 201 by soldering are not deformed so that occurrence of an accident such as connection failure can be reduced.

Although the base member is configured so as to be deformed curvedly in a direction opposite to the solder ball attachment surface as shown in FIG. 1, the base member may be configured so as to be deformed linearly in a direction opposite to the solder ball attachment surface as the location goes from the end portions of the base member to the central portion of the base member.

Figure 3:
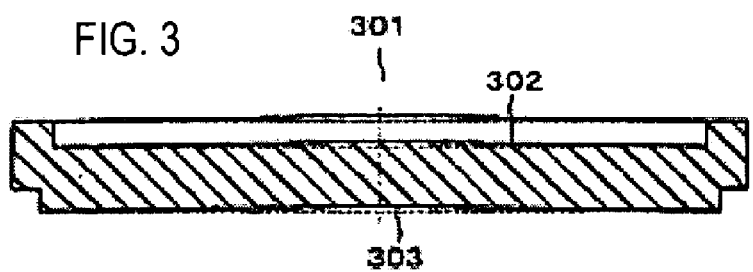
FIG. 3 is a view for explaining another exemplary base member used in the circuit component socket according to the embodiment of the invention.
Figure 4:
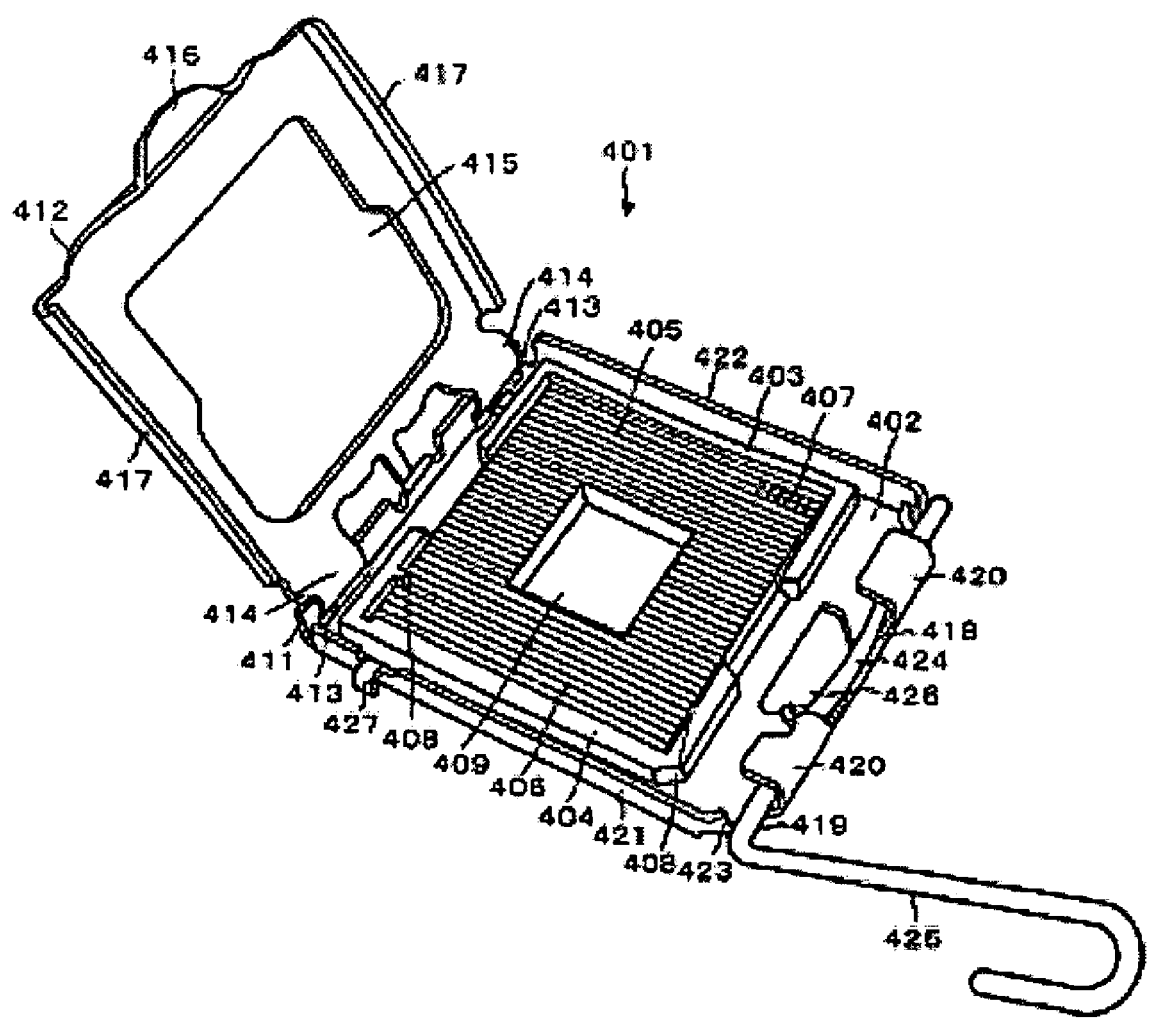
FIG. 4 is a view for explaining a general circuit component socket.
Figure 5:
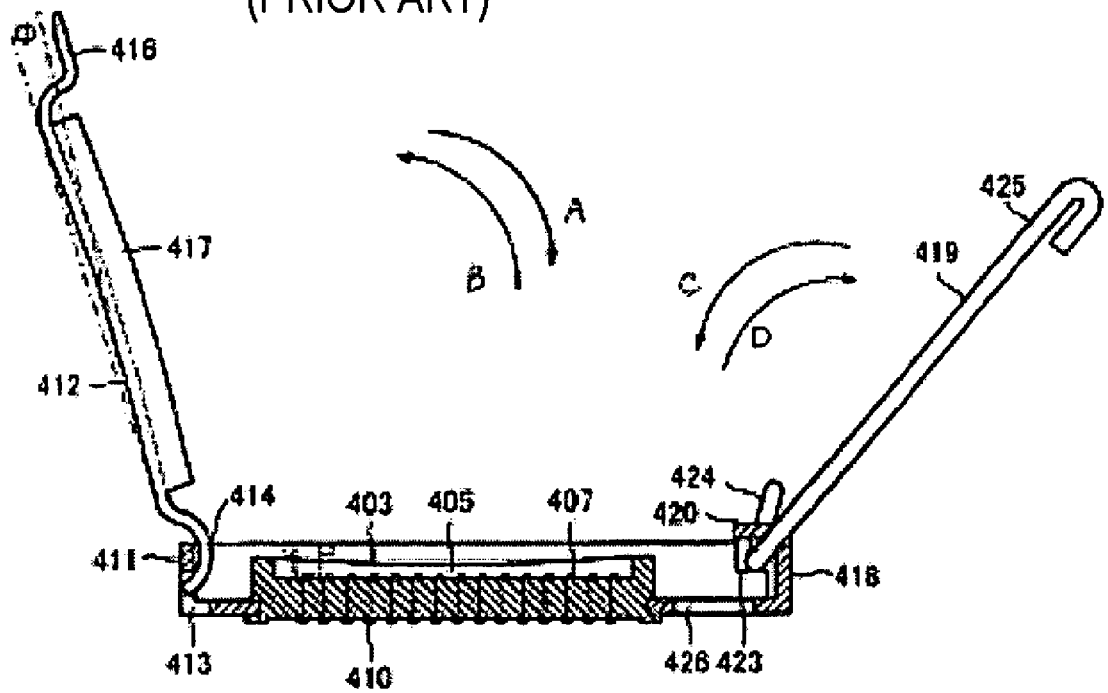
FIG. 5 is a view for explaining the general circuit component socket.
Figure 6:
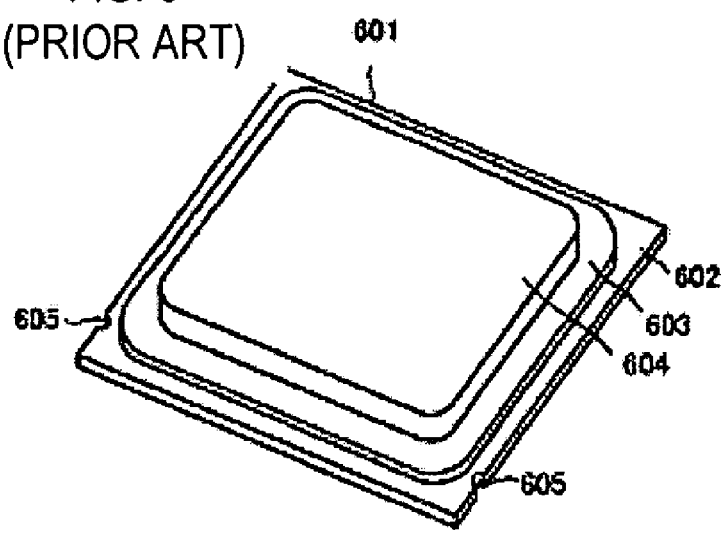
FIG. 6 is a view for explaining a circuit component to be mounted in the circuit component socket.
Figure 7:
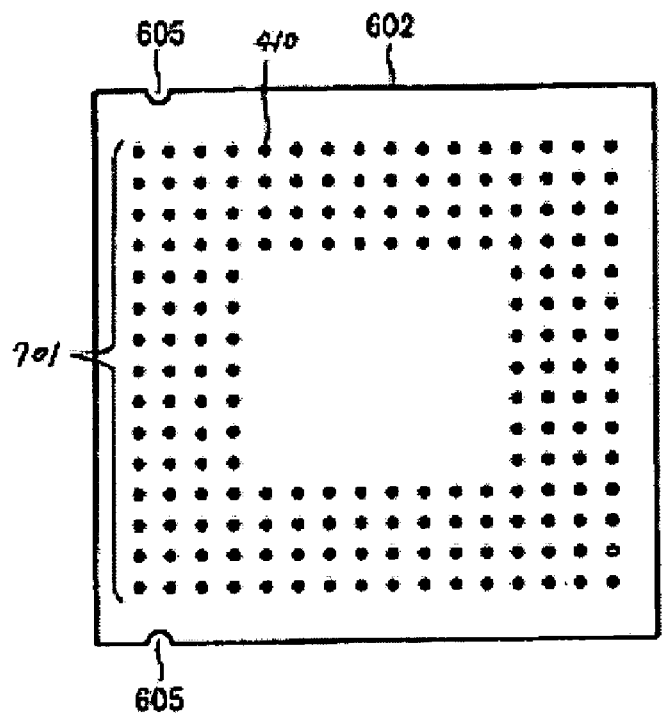
FIG. 7 is a view for explaining the circuit component to be mounted on the circuit component socket.
Figure 8:
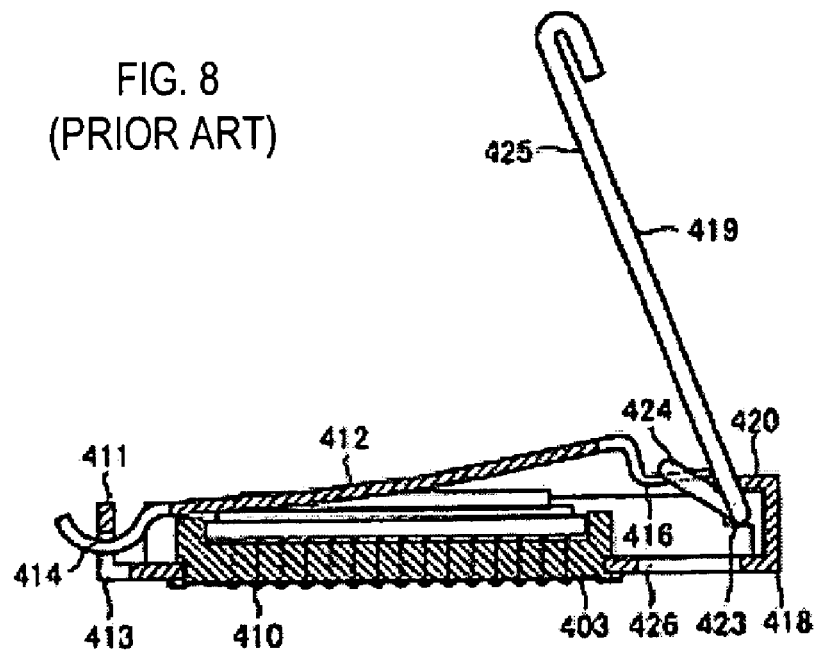
FIG. 8 is a view for explaining a state in which the circuit component is to be mounted in the general circuit component socket.
Figure 9:
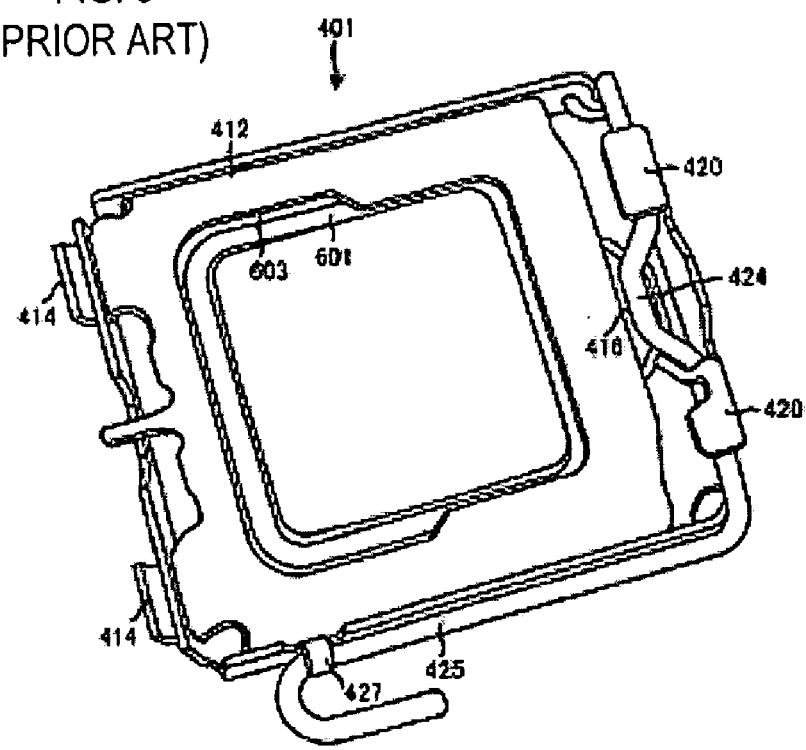
FIG. 9 is a view for explaining a state in which the circuit component has been mounted in the general circuit component socket.
Figure 10:
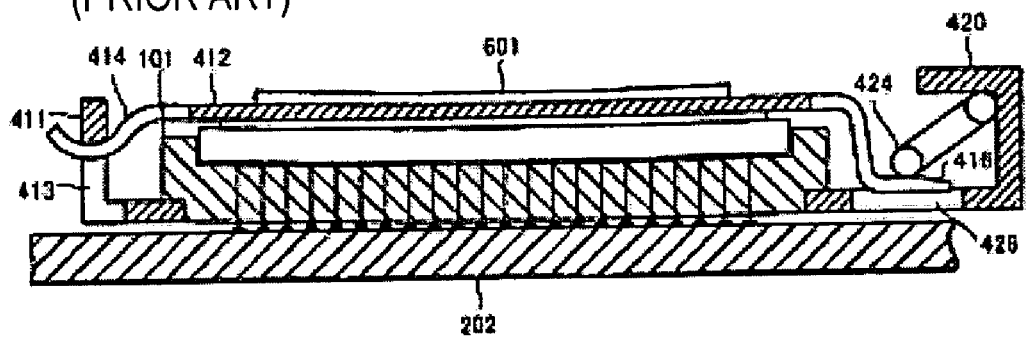
FIG. 10 is a view for explaining the general circuit component socket.

In FIG. 3, the base member 301 is configured so that the central portion of the base member 301 is deformed linearly in a direction opposite to the solder ball attachment surface. Also in the circuit component socket using the base member according to this embodiment, the solder ball attachment surface of the applied socket can be kept flat so that soldering failure can be reduced. Incidentally, in FIG. 3, the reference numeral 302 designates a circuit component storage portion; and 303, a connection terminal surface.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all the components disclosed in the embodiments. Further, components in different embodiments may be appropriately combined.

What is claimed is:

1. A circuit component socket comprising:
a frame;
a base member attached to the frame, the base member having a surface where a circuit component storage portion is formed for storing a circuit component, and a connection terminal surface as an opposite surface where connection terminals are formed to be electrically connected to electrodes of the circuit component stored in the circuit component storage portion and to be connected to a circuit board; and
a pressure clamping unit that presses the circuit component stored in the circuit component storage portion to the base member;
wherein the base member is formed so that the connection terminal surface of the base member is displaced by a predetermined amount in a direction toward the circuit component storage portion.

2. The circuit component socket according to claim 1, wherein the pressure clamping unit is configured so that force applied on a central portion of the circuit component storage portion to press the circuit component stored in the circuit component storage portion is smaller than force applied on a peripheral portion of the circuit component storage portion.

3. The circuit component socket according to claim 1, wherein the base member is formed so that the connection terminal surface of the base member deforms in a direction toward the circuit component storage portion so as to cancel deformation of the base member caused by pressing of the circuit component to the circuit component storage portion by the pressure clamping unit.

4. The circuit component socket according to claim 1, wherein the base member is formed so that the connection terminal surface of the base member is curved in a direction toward the circuit component storage portion.

5. The circuit component socket according to claim 1, wherein the base member is formed so that the connection terminal surface of the base member is inclined in a direction toward the circuit component storage portion.

* * * * *